(12) United States Patent
Tsai et al.

(10) Patent No.: US 9,466,700 B2
(45) Date of Patent: Oct. 11, 2016

(54) SEMICONDUCTOR DEVICE AND METHOD OF FABRICATING SAME

(71) Applicant: Macronix International Co., Ltd., Hsinchu (TW)

(72) Inventors: Jiun-Yan Tsai, Yanpu Township (TW); Shuo-Lun Tu, Hsin-Chu (TW); Shih-Chin Lien, Sinjhuang (TW); Shyi-Yuan Wu, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 111 days.

(21) Appl. No.: 14/955,750

(22) Filed: Dec. 1, 2015

(65) Prior Publication Data

US 2016/0087083 A1     Mar. 24, 2016

Related U.S. Application Data

(62) Division of application No. 14/045,612, filed on Oct. 3, 2013.

(51) Int. Cl.
*H01L 29/66* (2006.01)
*H01L 21/265* (2006.01)
*H01L 21/324* (2006.01)

(52) U.S. Cl.
CPC ... *H01L 29/66681* (2013.01); *H01L 21/26586* (2013.01); *H01L 21/324* (2013.01)

(58) Field of Classification Search
CPC ................................................. H01L 29/66681
USPC ......................................................... 257/339
See application file for complete search history.

(56) References Cited

U.S. PATENT DOCUMENTS

2015/0041894 A1\* 2/2015 Hebert ................ H01L 29/7816
257/339

\* cited by examiner

*Primary Examiner* — Ajay K Arora
(74) *Attorney, Agent, or Firm* — Finnegan, Henderson, Farabow, Garrett & Dunner LLP

(57) ABSTRACT

A lateral drain metal oxide semiconductor (LDMOS) device includes a well region having a second conductive type in a substrate, a body region having a first conductive type in the well region, a drift region having the second conductive type in the well region and spaced apart from the body region, a source region having the second conductive type in the body region, a drain region having the second conductive type in the drift region, a gate structure on the well region between the source region and the drain region, a shallow trench isolation (STI) structure in the drift region between the drain region and the source region, and a buried layer having the first conductive type in the well region under the drift region, a center of the buried layer being aligned with a center of the STI structure.

20 Claims, 4 Drawing Sheets

US 9,466,700 B2

SEMICONDUCTOR DEVICE AND METHOD OF FABRICATING SAME

This is a divisional of application Ser. No. 14/045,612, filed Oct. 3, 2013, which is incorporated herein by reference.

FIELD OF THE INVENTION

The present disclosure relates to a semiconductor device and a method of fabricating the same and, more particularly, to a lateral drain metal oxide semiconductor (LDMOS) device and a method of fabricating.

BACKGROUND OF THE INVENTION

Power management integrated circuits (PMIC) are widely used in display devices, portable devices, and other applications. A lateral drain metal oxide semiconductor (LDMOS) device is a high voltage device used in such PMICs. Design goals of a PMIC include lower power consumption and more effective power conversion. In order to achieve these goals, it is desirable for the LDMOS device to have a high breakdown voltage and a low on-resistance.

SUMMARY OF THE INVENTION

According to an embodiment of the disclosure, a method of manufacturing a transistor is provided. The method includes forming a trench in a substrate, and implanting a first dopant having a first conductive type into the substrate in a direction perpendicular to a major surface of the substrate by utilizing edges of the trench as an implantation mask, to form a buried layer under a bottom surface of the trench. The method also includes implanting a second dopant having a second conductive type into the substrate at various implant angles with respect to the direction perpendicular to the major surface of the substrate, to form a drift implantation layer along side walls and the bottom surface of the trench. The method further includes depositing a dielectric material in the trench.

According to another embodiment of the disclosure, a lateral drain metal oxide semiconductor (LDMOS) device is provided. The LDMOS device includes a well region having a second conductive type in a substrate, a body region having a first conductive type in the well region, a drift region having the second conductive type in the well region and spaced apart from the body region, a source region having the second conductive type in the body region, a drain region having the second conductive type in the drift region, a gate structure on the well region between the source region and the drain region, a shallow trench isolation (STI) structure in the drift region between the drain region and the source region, and a buried layer having the first conductive type in the well region under the drift region, a center of the buried layer being aligned with a center of the STI structure.

DESCRIPTION OF THE EMBODIMENTS

Reference will now be made in detail to the present embodiments, examples of which are illustrated in the accompanying drawings. Wherever possible, the same reference numbers will be used throughout the drawings to refer to the same or like parts.

Figure 1:
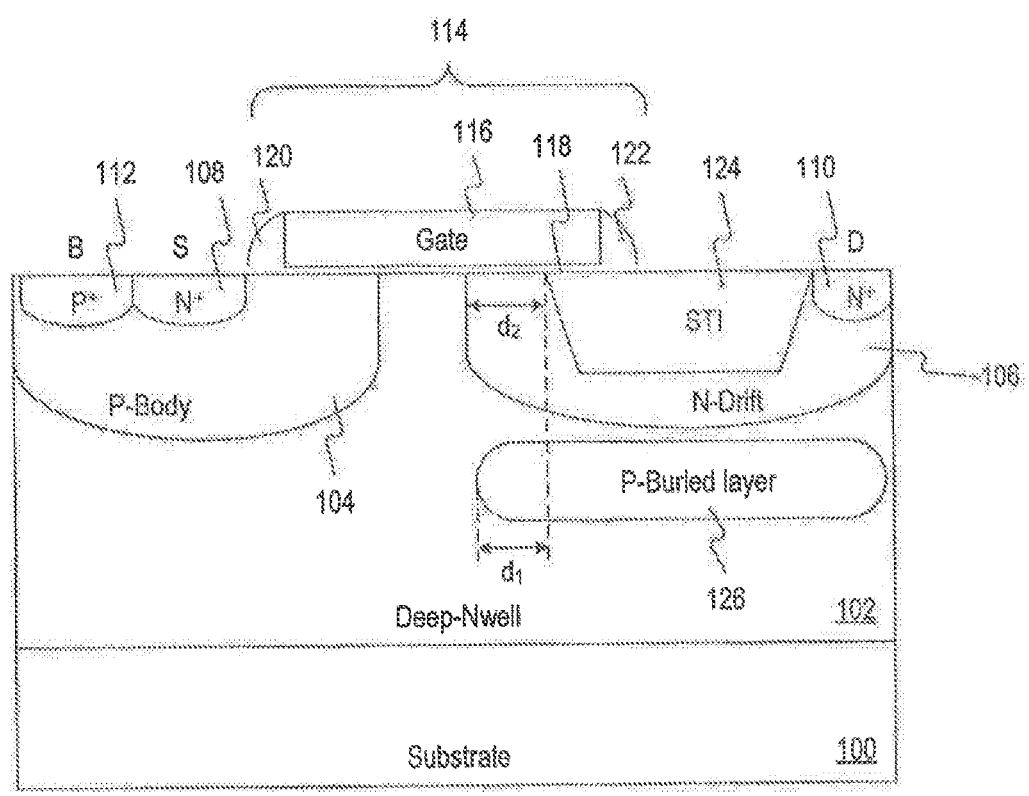
FIG. 1 is a partial cross-sectional view of a lateral drain metal oxide semiconductor (LDMOS) device constructed according to an exemplary embodiment.

FIG. 1 is a partial cross-sectional view of a lateral drain metal oxide semiconductor (LDMOS) device 10 constructed according to an exemplary embodiment. Referring to FIG. 1, LDMOS device 10 includes an N-type deep well region 102 formed in a substrate 100; a P-type body region 104 formed in N-type deep well region 102; an N-type drift region 106 formed in N-type deep well region 102 and spaced apart from P-type body region 104; an $N^+$-type source region 108 formed in P-type body region 104 and an $N^+$-type drain region 110 formed in N-type drift region 106; a $P^+$-type body contact region 112 formed in P-type body region 104, in contact with $N^+$-type source region 108, and on one side of $N^+$-type source region 108 opposite to N-type drift region 106; a gate structure 114 formed on N-type deep well region 102 between $N^+$-type source region 108 and $N^+$-type drain region 110, and including a gate electrode 116, a gate dielectric layer 118, and gate spacers 120 and 122 formed on sidewalls of gate electrode 116 and gate dielectric layer 118; a shallow trench isolation (STI) structure 124 formed in N-type drift region 106 between $N^+$-type drain region 110 and $N^+$-type source region 108; and a P-type buried layer 126 formed in N-type deep well region 102 under N-type drift region 106. The center of P-type buried layer 126 and the center of N-type drift region 106 are generally aligned with the center of STI structure 124.

In LDMOS device 10, the doping concentration of P-type buried layer 126 is on the same order as that of N-type deep well region 102. In addition, the doping concentrations of $N^+$-type source region 108 and $N^+$-type drain region 110 are higher than the doping concentrations of P-type body region 104 and N-type drift region 106.

The presence of P-type buried layer 126 increases a drain-to-source breakdown voltage $BV_{DSS}$ and decreases a specific on-resistance $R_{ONSP}$ of LDMOS device 10. The drain-to-source breakdown voltage $BV_{DSS}$ is the maximum drain-to-source voltage that LDMOS device 10 can withstand before it breaks down when it is switched off. The specific on-resistance $R_{ONSP}$ is the resistance of LDMOS device 10 when it is switched on.

Specifically, when LDMOS device 10 is switched off, i.e., when LDMOS device is in an off-status, $N^+$-type source region 108 and $P^+$-type body contact region 112 are electrically connected, a forward voltage is applied between $N^+$-type drain region 110 and $N^+$-type source region 108, and a zero voltage is applied between gate electrode 116 and $N^+$-type source region 108. As a result, a bulk electric field is formed in N-type drift region 106 to make it substantially depleted. The presence of P-type buried layer 126 reduces the bulk electric field formed in N-type drift region 106, and results in uniform electric field distributions. Therefore, N-type drift region 106 can be fully depleted before it breaks down. In other words, the presence of P-type buried layer 126 increases the drain-to-source breakdown voltage $BV_{DSS}$ of LDMOS device 10.

In addition, the doping concentration of N-type drift region 106 is relatively high in order to obtain a low specific on-resistance $R_{ONSP}$ of LDMOS device 10. However, the relatively high doping concentration of N-type drift region 106 could have the effect of reducing the drain-to-source breakdown voltage $BV_{DSS}$. This effect is counteracted by P-type buried layer 126. As noted above, in LDMOS device 10 of FIG. 1, the presence of P-type buried layer 126 has an opposite effect of increasing the drain-to-source breakdown voltage $BV_{DSS}$ up to a physical limit, while maintaining the low specific on-resistance $R_{ONSP}$. The doping concentration of P-type buried layer 126 is determined based on a specific requirement for the drain-to-source breakdown voltage $BV_{DSS}$ for the particular application of LDMOS device 10.

In addition to doping concentration, a lateral distance $d_1$ between an edge of P-type buried layer 126 and an edge of STI structure 124, and a lateral distance $d_2$ between an edge of N-type drift region 106 and the edge of STI structure 124 also affect the breakdown voltage $BV_{DSS}$ and the specific on-resistance $R_{ONSP}$. When fabrication conditions change, the lateral distances $d_1$ and $d_2$ may change, and consequently the breakdown voltage $BV_{DSS}$ and the specific on-resistance $R_{ONSP}$ may change as well. Therefore, in LDMOS device 10 of FIG. 1, P-type buried layer 126 and N-type drift region 106 are positioned to be aligned relative to STI structure 124. In other words, the center of P-type buried layer 126 and the center of N-type drift region 106 are positioned to be aligned with the center of STI structure 124. As a result, the lateral distances $d_1$ and $d_2$ can be stabilized. As described more fully below, the alignment of P-type buried layer 126 and N-type drift region 106 relative to STI structure 124 is achieved by particular aspects of the method of fabricating LDMOS 10.

FIGS. 2A-2H are partial cross-sectional views illustrating an exemplary method of fabricating LDMOS device 10 in accordance with an embodiment.

Figure 2A:
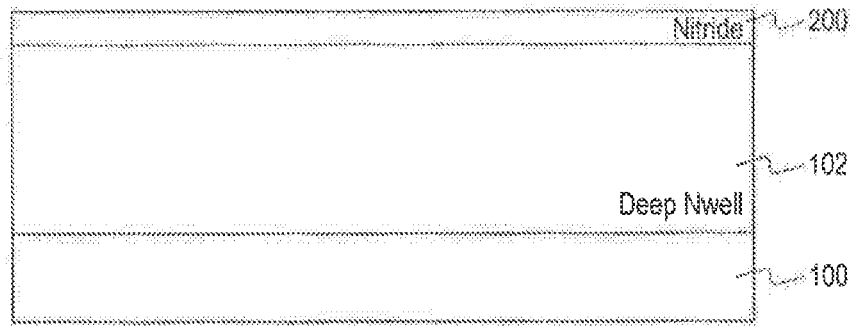
FIGS. 2A-2H are partial cross-sectional views illustrating an exemplary method of fabricating the LDMOS device of FIG. 1 in accordance with an embodiment.

Referring to FIG. 2A, N-type deep well region 102 is formed in substrate 100. N-type deep well region 102 may be formed by performing an ion implantation process to implant an N-type dopant into substrate 100, and then performing a heating process to drive the N-type dopant deep into substrate 100 to reach a predetermined depth. An example of a suitable N-type dopant for N-type deep well region 102 is phosphorous. An exemplary range of doping concentration of phosphorous dopant in N-type deep well region 102 is about $2 \times 10^{12}/cm^2$ to $5 \times 10^{12}/cm^2$. Next, a nitride layer 200 is formed on substrate 100 to cover N-type deep well region 102. Nitride layer 200 may include silicon nitride ($Si_xN_y$), and may be formed by a chemical vapor deposition (CVD) process.

Figure 2B:
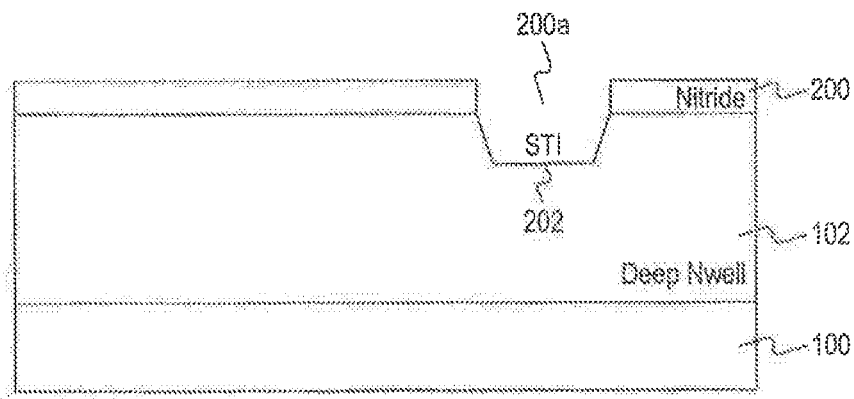

Referring to FIG. 2B, an opening 200a is formed in nitride layer 200 to expose a surface of N-type deep well region 102. Opening 200a is formed by a photolithography process followed by an etching process. An exemplary range for the width of opening 200a is 0.5 μm to 2.6 μm. Increasing the width of opening 200a increases the drain-to-source breakdown voltage $BV_{DSS}$ and the specific on-resistance $R_{ONSP}$ of LDMOS device 10; and vice versa. Therefore, the width of opening 200a is determined based on a specific requirement for the drain-to-source breakdown voltage $BV_{DSS}$ and the specific on-resistance $R_{ONSP}$ for the particular application of LDMOS device 10. Afterwards, the exposed surface of N-type deep well region 102 is etched by using nitride layer 200 as an etching mask to form a STI trench 202 in N-type deep well region 102. The depth of STI trench 202 may vary, and is determined by the particular application of LDMOS device 10. For example, the depth of STI trench 202 can be set in a range of about 350 nm to 400 nm.

Figure 2C:
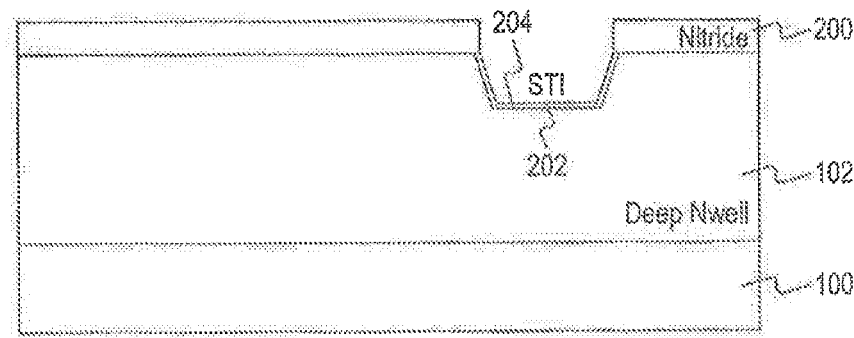

Referring to FIG. 2C, a liner oxide 204 is formed on exposed surfaces of STI trench 202. Liner oxide 204 can be provided as, for example, silicon oxide formed by a thermal oxidation process. Liner oxide 204 can have a thickness of, for example, a few hundred angstroms.

Figure 2D:
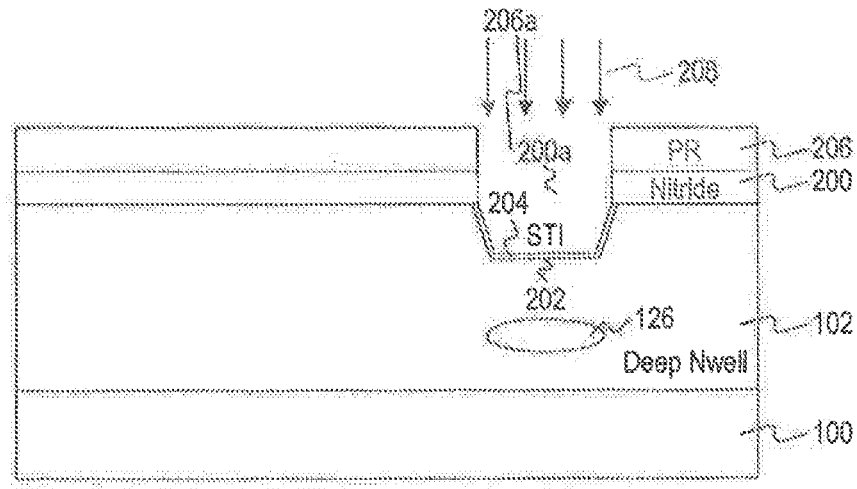

Referring to FIG. 2D, a photoresist layer 206 having an opening 206a is formed on nitride layer 200. Opening 206a is vertically aligned with opening 200a of nitride layer 200, exposing STI trench 202 formed with liner oxide 204.

Opening 206B of photoresist layer 206 is formed by performing a photolithography process. Thereafter, a buried implantation process 208 is performed to implant a P-type dopant into N-type deep well region 102 using nitride layer 200, photoresist layer 206, and an edge of STI trench 202 as implantation masks. Buried implantation process 208 is controlled such that the P-type dopant is implanted in a direction perpendicular to the major surface of substrate 100 (hereinafter referred to as the "vertical direction"), and the mean implantation depth is below the bottom surface of STI trench 202. As a result of buried implantation process 208, the P-type dopant is implanted locally under STI trench 202 to form P-type buried layer 126. P-type buried layer 126 is spaced apart from the bottom surface of STI trench 202 by a distance of, for example, 1 μm. In this manner, P-type buried layer 126 is aligned with STI trench 202. An example of a suitable P-type dopant used in buried implantation process 208 is boron. The doping concentration of P-type buried layer 126 is on the same order as that of N-type deep well region 102, so that N-type drift region 106 can be fully depleted before it breaks down when LDMOS device 10 is switched off. In some embodiments, buried implantation process 208 may include one or multiple implantation processes. The process parameters of buried implantation process 208, such as, for example, dopant dosage and Implant energy, may be varied depending upon the particular application of LDMOS device 10. For example, the implant energy of buried implantation process 208 can be 800 KeV to 1200 KeV, and the Implant angle can be 0°.

Figure 2E:
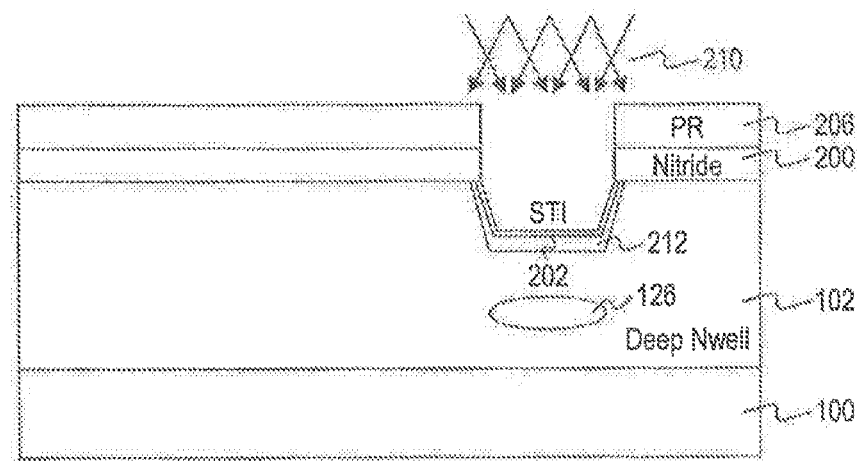

Referring to FIG. 2E, a drift implantation process 210 is performed to implant an N-type dopant into N-type deep well region 102 using nitride layer 200 and photoresist layer 206 as implantation masks. Drift implantation process 210 is controlled such that the N-type dopant is implanted at various angles with respect to the vertical direction. As a result of drift implantation process 210, the N-type dopant is implanted into N-type deep well region 102 along the sidewalls and the bottom surface of STI trench 202 to form an N-type drift implantation layer 212. Because drift implantation process 210 also uses nitride layer 200 and photoresist layer 206 as implantation masks, N-type drift implantation layer 212 is also aligned relative to STI trench 202. An example of a suitable N-type dopant used in drift implantation process 210 is phosphorous. The doping concentration of N-type drift implantation layer 212 is related to the breakdown voltage $BV_{DSS}$ and the specific on-resistance $R_{ONSP}$ of LDMOS 10, such that the higher the doping concentration, the lower the specific on-resistance $R_{ONSP}$, and the lower the breakdown voltage $BV_{DSS}$. An exemplary range of the doping concentration of N-type drift implantation layer 212 is about $2 \times 10^{12}/cm^2$ to $4.5 \times 10^{12}/cm^2$. The process parameters of drift implantation process 210, such as, for example, dopant dosage, implant energy, and Implant angle, may be varied depending upon the particular application of LDMOS device 10. An exemplary range of the implantation angle for drift implantation process 210 is about 7° to 30°. An exemplary range of the dopant dosage for drift implantation process 210 is about $1 \times 10^{12}/cm^2$ to $3 \times 10^{12}/cm^2$.

Figure 2F:
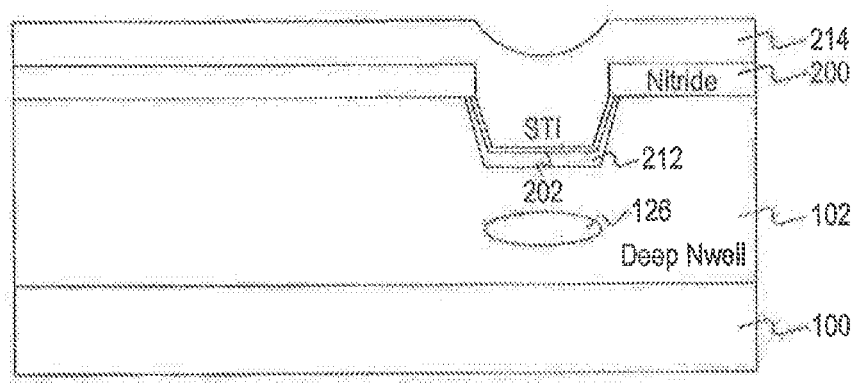

Referring to FIG. 2F, photoresist layer 206 is removed. Next, a dielectric layer 214 is formed over the structure of FIG. 2E to fill STI trench 202. The dielectric layer 214 can be provided as, for example, silicon oxide formed by a CVD process.

Figure 2G:
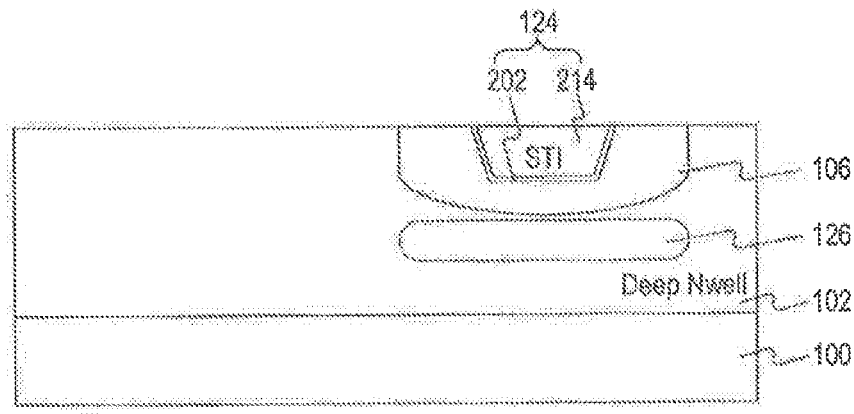

Referring to FIG. 2G, dielectric layer 214 is densified by performing a thermal annealing process. For example, the thermal annealing process can be performed at 1150° C. for 150 minutes. During the annealing process, the N-type dopant in N-type drift implantation layer 212 diffuses laterally away from STI trench 202 and vertically towards the bottom of N-type deep well region 102, thereby forming N-type drift region 106. The P-type dopant in P-type buried layer 126 also diffuses laterally and vertically. Thereafter, a planarization process is performed to remove nitride layer 200 and the unwanted portion of dielectric layer 214, exposing a surface of N-type deep well region 102. The planarization process can be performed by a chemical mechanical polishing (CMP) process. As a result, STI structure 124 including STI trench 202 and the densified dielectric layer 214 is formed. Since buried implantation process 208 results in P-type buried layer 126 being aligned relative to STI trench 202 and drift implantation process 210 results in N-type drift implantation layer 212 being aligned relative to STI trench 202, the subsequent process steps result in P-type buried layer 126 and N-type drift region 106 being aligned relative to STI structure 124.

Figure 2H:
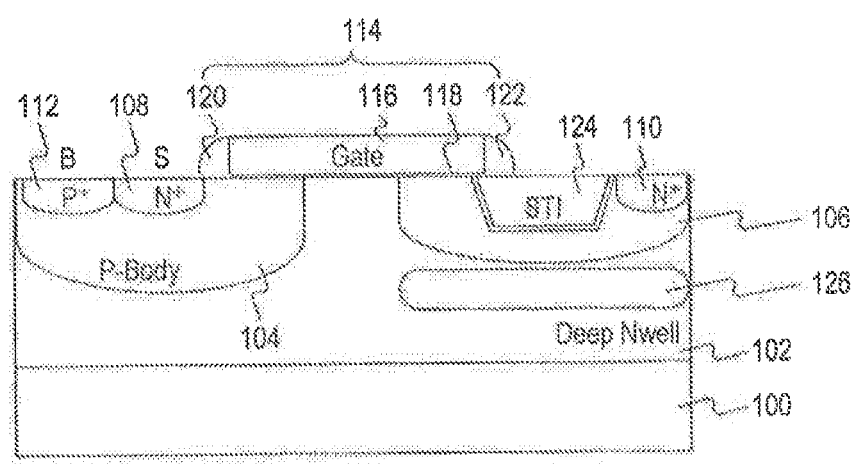

Referring to FIG. 2H, the process then continues in a manner well known to those skilled in the art to complete the structure of LDMOS device 10. As shown in FIG. 2H, a P-type implantation process and a diffusion process are performed to form P-type body region 104 in N-type deep well region 102 separated from N-type drift region 106. An example of a suitable P-type dopant for the P-type implantation process is boron. An exemplary range for the depth of P-type body region 104 is be 1 µm to 2 µm. The doping concentration of P-type body region 104 is determined based on the particular application of LDMOS device 10. For example, the doping concentration of P-type body region 104 can be $5 \times 10^{12}/cm^2$ to $1.2 \times 10^{13}/cm^2$.

Gate electrode 116 and gate oxide layer 118 are formed on N-type deep well region 102, overlying a portion of P-type body region 104 and a portion of N-type drift region 106. Gate electrode 116 can include, for example, polysilicon. Gate oxide layer 118 can include, for example, silicon oxide. Then, spacers 120 and 122 are formed on sidewalls of gate electrode 116 and gate oxide layer 118.

In another embodiment, gate electrode 116 and gate oxide layer 118 are formed before forming P-type body region 104. Then, a P-type implantation process is performed by using gate electrode 116 and gate oxide layer 118 to form P-type body region 104.

Next, an N-type ion implantation process is performed to form $N^+$-type source region 108 in P-type body region 104 and $N^+$-type drain region 110 in N-type drift region 106. An example of a suitable N-type dopant for the N-type ion implantation process is phosphorous. An example of the doping concentration of $N^+$-type source region 108 and $N^+$-type drain region 110 is about $3 \times 10^{15}/cm^2$ to form ohmic contact. A P-type ion implantation process is performed to form P-type body contact region 112 in P-type body region 104. An example of a suitable P-type dopant for the P-type ion implantation process is boron. The doping concentration of $P^+$-type body contact region 112 can be, for example, about $3 \times 10^{15}/cm^2$.

In the aforementioned fabrication method, both of buried implantation process 208 and drift implantation process 210 use the same nitride layer 200 and photoresist layer 206 as implantation masks. Therefore, the centers of N-type drift region 106, STI structure 124, and P-type buried layer 126 are generally aligned. As a result, the differences in the breakdown voltage and the on-resistance in different devices are reduced, and process stability is achieved.

In addition, no additional photolithography process is required for performing buried implantation process 208 and drift implantation process 210. Therefore, the process of fabricating LDMOS 10 can be integrated with standard processes of fabricating complementary metal oxide semiconductor (CMOS) devices.

While the embodiments described above are directed to NLDMOS devices and fabrication methods, those skilled in the art will appreciate that the disclosed concepts are equally applicable to PLDMOS devices. Those skilled in the art will also appreciate that the methods described above may be used to fabricate alternative devices, such as extended drain metal oxide semiconductor (EDMOS) devices, and Bipolar, CMOS, and LDMOS (BCD) integrated circuits composed of Bipolar Junction Transistors, CMOS devices, and LDMOS devices. In addition, the methods described above may also be used to fabricate devices having other structures such as deep trench isolation (DTI) structures, a silicon on insulator (SOI) substrate, and an epitaxially grown semiconductor layer.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a transistor, comprising:
    forming a trench in a substrate;
    implanting a first dopant having a first conductive type into the substrate in a direction perpendicular to a major surface of the substrate by utilizing edges of the trench as an implantation mask, to form a buried layer under a bottom surface of the trench;
    implanting a second dopant having a second conductive type into the substrate at various implant angles with respect to the direction perpendicular to the major surface of the substrate, to form a drift implantation layer along side walls and the bottom surface of the trench; and
    depositing a dielectric material in the trench.

2. The method of claim 1, further including:
    forming a first mask over the substrate before forming the trench in the substrate, the first mask having a first opening exposing a surface of the substrate;
    etching the exposed surface of the substrate to form the trench in the substrate;
    forming a second mask over the first mask, the second mask having a second opening exposing the trench; and
    removing the first mask and the second mask after depositing the dielectric material in the trench.

3. The method of claim 2, wherein the first mask includes a nitride material deposited over the substrate.

4. The method of claim 2, wherein the second mask includes a photoresist.

5. The method of claim 1, wherein the dielectric material includes silicon oxide.

6. The method of claim 1, wherein the first conductive type is P-type and the second conductive type is N-type.

7. The method of claim 1, wherein the first conductive type is N-type and the second conductive type is P-type.

8. The method of claim 1, further including:
    performing a thermal annealing process to densify the dielectric material in the trench, and to diffuse the second dopant implanted along the side walls and the bottom surface of the trench to form a drift region.

9. The method of claim 1, further including:
    forming a well region in the substrate; and
    forming the trench and the buried layer in the well region.

10. The method of claim 1, further including:
after depositing the dielectric material in the trench, forming a gate electrode and a gate dielectric layer over a channel region in the well region;
forming a body region having the first conductive type in the well region;
forming a source region having the second conductive type in the body region and a drain region having the second conductive type in the drift region; and
forming a body contact having the first conductive type in the body region.

11. The method of claim 1, further including:
before implanting the first dopant, forming a liner oxide layer on the side walls and the bottom surface of the trench.

12. A method of manufacturing a transistor, comprising:
forming a trench in a substrate;
forming a buried layer having a first conductive type under a bottom surface of the trench;
forming a drift region having a second conductive type along side walls and the bottom surface of the trench; and
depositing a dielectric material in the trench.

13. The method of claim 12, wherein forming the buried layer includes:
forming a mask layer on the substrate, the mask layer including an opening exposing the trench; and
implanting a first dopant having the first conductive type into the substrate in a direction perpendicular to a major surface of the substrate by utilizing edges of the trench and the mask layer as an implantation mask, to form the buried layer.

14. The method of claim 13, wherein forming the drift region includes:
implanting a second dopant having the second conductive type into the substrate at various implant angles with respect to the direction perpendicular to the major surface of the substrate, to form a drift implantation layer along the side walls and the bottom surface of the trench; and
performing a thermal annealing process to diffuse the second dopant to form the drift region.

15. The method of claim 12, further including:
before implanting the first dopant, forming a liner oxide layer on the side walls and the bottom surface of the trench.

16. The method of claim 13, wherein the mask layer includes a nitride material.

17. The method of claim 12, wherein the dielectric material includes silicon oxide.

18. The method of claim 12, wherein the first conductive type is P-type and the second conductive type is N-type.

19. The method of claim 12, wherein the first conductive type is N-type and the second conductive type is P-type.

20. The method of claim 12, further including:
forming a well region in the substrate; and
forming the trench and the buried layer in the well region.

* * * * *